United States Patent
Li et al.

(10) Patent No.: US 11,640,081 B2
(45) Date of Patent: May 2, 2023

(54) BACKLIGHT MODULE AND DISPLAY DEVICE

(71) Applicants: K-TRONICS (SUZHOU) TECHNOLOGY CO., LTD., Jiangsu (CN); BOE Technology Group Co., Ltd., Beijing (CN)

(72) Inventors: Zhongcheng Li, Beijing (CN); Zhifu Zheng, Beijing (CN)

(73) Assignees: K-TRONICS (SUZHOU) TECHNOLOGY CO., LTD., Jiangsu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/956,219

(22) PCT Filed: Aug. 26, 2019

(86) PCT No.: PCT/CN2019/102646
§ 371 (c)(1),
(2) Date: Jun. 19, 2020

(87) PCT Pub. No.: WO2021/035496
PCT Pub. Date: Mar. 4, 2021

(65) Prior Publication Data
US 2022/0179263 A1    Jun. 9, 2022

(51) Int. Cl.
*G02F 1/00*      (2006.01)
*G02F 1/13357*   (2006.01)

(52) U.S. Cl.
CPC .. *G02F 1/133603* (2013.01); *G02F 1/133605* (2013.01)

(58) Field of Classification Search
None
See application file for complete search history.

(56) References Cited

U.S. PATENT DOCUMENTS

| | | | |
|---|---|---|---|
| 10,969,628 B1* | 4/2021 | Zweigle | G02F 1/133608 |
| 2007/0153511 A1 | 7/2007 | Chou | |
| 2012/0262631 A1* | 10/2012 | Kuromizu | G02F 1/133608 |
| | | | 362/602 |
| 2015/0009681 A1* | 1/2015 | Takase | G02F 1/133603 |
| | | | 362/308 |
| 2018/0023784 A1* | 1/2018 | Tamura | G02F 1/133611 |
| | | | 362/235 |
| 2020/0073174 A1* | 3/2020 | Yasunaga | G02F 1/133603 |
| 2020/0161516 A1* | 5/2020 | Sasaoka | G02B 5/1876 |
| 2020/0285113 A1* | 9/2020 | Shimizu | F21S 6/002 |
| 2020/0326594 A1* | 10/2020 | Chang | G02F 1/133605 |
| 2021/0074693 A1* | 3/2021 | Sim | G02F 1/133605 |

FOREIGN PATENT DOCUMENTS

| | | |
|---|---|---|
| CN | 201764409 U | 3/2011 |
| CN | 207457660 U | 6/2018 |
| KR | 20140005462 A | 10/2014 |

* cited by examiner

*Primary Examiner* — Gerald J Sufleta, II
(74) *Attorney, Agent, or Firm* — ArentFox Schiff LLP; Michael Fainberg (57) ABSTRACT

Embodiments of the present disclosure provides a backlight module and a display device. The backlight module includes a backboard and a reflecting sheet located on the backboard; the reflecting sheet includes a body and a plurality of hollow areas, wherein the body surrounding at least one of the hollow areas is provided with one or more openings.

17 Claims, 9 Drawing Sheets

BACKLIGHT MODULE AND DISPLAY DEVICE

CROSS-REFERENCE TO RELATED APPLICATIONS

This application is a National Stage of International Application No. PCT/CN2019/102646, filed Aug. 26, 2019, which is hereby incorporated by reference in its entirety.

FIELD

The present disclosure relates to the technical field of display and in particular to a backlight module and a display device.

BACKGROUND

The display effect of a liquid crystal display device is greatly affected by the light emitting effect of a backlight module. For a direct-type backlight module, the outsides of Light Emitting Diode (LED) chips are covered with lenses to form light emitting devices. When deforming due to the effect of thermal expansion and cold contraction, a reflecting sheet may apply a certain force to lenses, which may result in the falloff of the lenses, thereby affecting the display effect.

SUMMARY

An embodiment of the present disclosure provides a backlight module including:
a backboard; and
a reflecting sheet, located on the backboard;
the reflecting sheet including a body and a plurality of hollow areas; and
the body surrounding at least one of the hollow areas being provided with at least one opening.

Optionally, in some embodiments of the present application, the opening is a slit, and the body surrounding at least one of the hollow areas is provided with one or more of the slits.

Optionally, in some embodiments of the present application, the slits surrounding the hollow areas penetrate through the reflecting sheet.

Optionally, in some embodiments of the present application, the slits surrounding the hollow areas are connected with the hollow areas of the reflecting sheet.

Optionally, in some embodiments of the present application, the hollow areas include round hollow areas, and the slits are equidistantly arranged on the body and are arranged on radius extension lines of the round hollow areas.

Optionally, in some embodiments of the present application, the hollow areas include rectangular hollow areas; and
an extension line of at least one diagonal of the rectangular hollow areas is provided with the slits, and extension directions of the slits are the same as an extension direction of the extension line of the diagonal.

Optionally, in some embodiments of the present application, the hollow areas comprise rectangular hollow areas; and at least one side of an extension line of at least one diagonal of the rectangular hollow area is provided with the slits, and extension directions of the slits are same as an extension direction of the extension line of the diagonal.

Optionally, in some embodiments of the present application, the hollow areas include rectangular hollow areas; a perpendicular bisector of at least one side in four sides of the rectangular hollow area is provided with the slits, and extension directions of the slits are the same as an extension direction of the perpendicular bisector; and/or
two sides of a perpendicular bisector of at least one side of in four sides of the rectangular hollow area are provided with the slits, and extension directions of the slits are the same as an extension direction of the perpendicular bisector.

Optionally, in some embodiments of the present application, two sides of the extension line of the diagonal of the rectangular hollow area are provided with one slit respectively, and extension directions of two slits are same as an extension direction of the extension line of the diagonal; and the two slits are in mirror symmetry relative to the extension line of the diagonal.

Optionally, in some embodiments of the present application, a length of the slits is 1 mm-2 mm.

Optionally, in some embodiments of the present application, widths of at least two of the plurality of slits are equal.

Optionally, in some embodiments of the present application, a width of at least one of the plurality of slits is decreased with increment of distance from the at least one slit to the hollow area.

Optionally, in some embodiments of the present application, the slits are triangular or shaped like a part of an ellipse.

Optionally, in some embodiments of the present application, the backlight module further includes light emitting devices;
the light emitting devices are arranged on the backboard exposed out of the hollow areas;
at least one of the light emitting devices comprises a light emitting chip and a lens, the light emitting chip is located on the backboard, and the lens covers the light emitting chip; and
an orthographic projection of the lens on the backboard are complementary to an orthographic projection of the body on the backboard.

Optionally, in some embodiments of the present application, the body of the reflecting sheet between two adjacent lenses is arch, a convex surface of the arched body of the reflecting sheet faces the backboard, and an end surface of the arched body of the reflecting sheet clings to the lenses, the end surface forms a profile of hollow area.

Optionally, in some embodiments of the present application, the backlight module further includes a plurality of mutually independent adhesive points between the lenses and the backboard; and
an extension line from the opening arranged on the body surrounding the hollow area to the center of the hollow area is provided with one or more adhesive points for connecting the backboard and the lens.

Optionally, in some embodiments of the present application, at least one of the hollow areas is a round hollow area, and provided with a plurality of slits, and the plurality of slits are equidistantly arranged on radius extension lines of the round hollow area; and the hollow areas provided with the slits is periodically arranged on the reflecting sheet.

Optionally, in some embodiments of the present application, the hollow areas include rectangular hollow areas; the hollow areas provided with the slits are periodically arranged on the reflecting sheet;
an extension line of at least one diagonal of the rectangular hollow area is provided with the slits, and extension directions of the slits are same as an extension direction of the extension line of the diagonal; and/or
at least one side of an extension line of at least one diagonal of the rectangular hollow area is provided with the slits, and extension directions of the slits are same as an extension direction of the extension line of the diagonal; and/or a perpendicular bisector of at least one side in four sides of the rectangular hollow area is provided with the slits, and extension directions of the slits are same as an extension direction of the perpendicular bisector; and/or two sides of a perpendicular bisector of at least one side of in four sides of the rectangular hollow area are provided with one slit respectively, and extension directions of slits are same as an extension direction of the perpendicular bisector; and/or two sides of the extension line of the diagonal of the rectangular hollow area are provided with one slit respectively, and extension directions of two slits are same as an extension direction of the extension line of the diagonal; and the two slits are in mirror symmetry relative to the extension line of the diagonal.

An embodiment of the present disclosure further provides a display device including a display panel and the backlight module according to any one of aforementioned embodiments, the backlight module is arranged at a light incident side of the display panel.

DETAILED DESCRIPTION OF THE EMBODIMENTS

In order to make objectives, technical solutions and advantages of the embodiments of the present disclosure clearer, the technical solutions in some embodiments of the present disclosure will be described clearly and completely below in conjunction with accompanying drawings in some embodiments of the present disclosure. Obviously, the described embodiments are a part of the embodiments of the present disclosure, not all the embodiments. Furthermore, the embodiments in the present disclosure and features in some embodiments may be combined with each other without conflicts. Based on the described embodiments of the present disclosure, all other embodiments obtained by those of ordinary skill in the art without creative work shall fall within the protection scope of the present disclosure.

Unless otherwise defined, technical terms or scientific terms used in the present disclosure shall be ordinary meanings as understood by those of ordinary skill in the art of the present disclosure. The words "first", "second" and similar terms used in the present disclosure do not denote any order, quantity or importance, but are merely used to distinguish different components. The word "including" or "includes" or the like means that the element or item preceding the word covers the element or object listed after the word and its equivalent, without excluding other elements or objects. The words "connection" or "connected" and the like are not limited to physical or mechanical connections, but may include electrical connections, whether direct or indirect.

It should be noted that the sizes and shapes of all patterns in the accompanying drawings do not reflect real scales, and are merely to illustrate the contents of the present disclosure. Furthermore, same or similar numerals throughout indicate same or similar elements or elements with same or similar functions.

Figure 1:
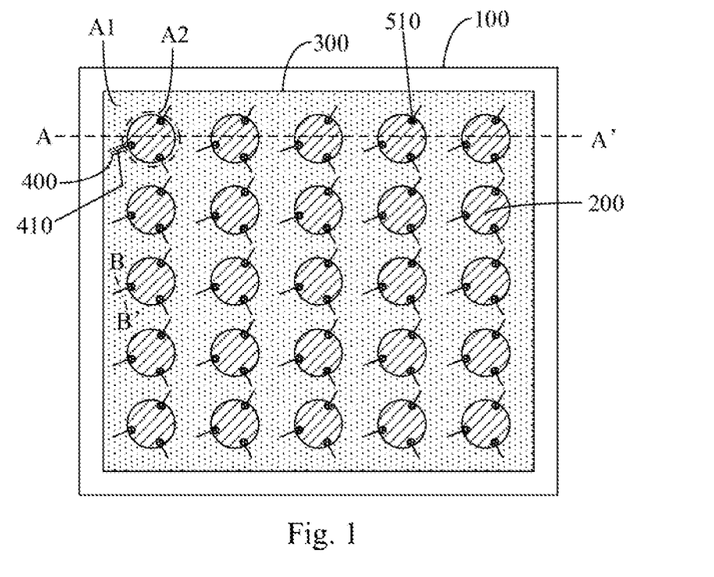
FIG. 1 is a schematic diagram of a top view structure of a backlight module provided by an embodiment of the present disclosure.
Figure 2A:
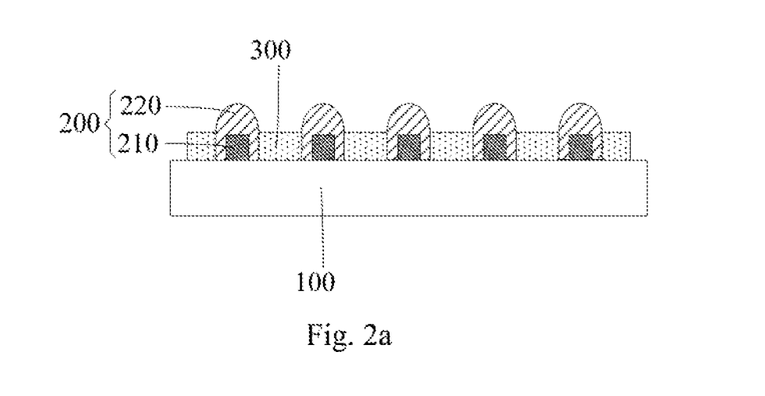
FIG. 2a is a schematic diagram of a sectional structure of the backlight module as shown in FIG. 1 along a direction AA'.
Figure 2B:
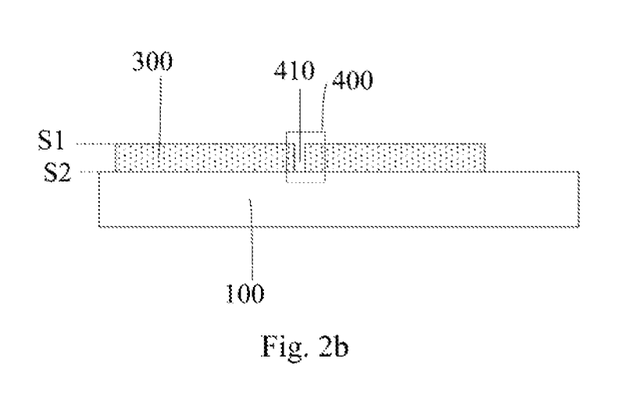
FIG. 2b is a schematic diagram of a sectional structure of the backlight module as shown in FIG. 1 along a direction BB'.

An embodiment of the present disclosure provides a backlight module, as shown in FIG. 1 to FIG. 2b, the backlight module includes:

a backboard 100; and a reflecting sheet 300, located on the backboard 100;

the reflecting sheet 300 including a body A1 and a plurality of hollow areas A2; and the body A1 surrounding at least one of the hollow areas A2 being provided with one or more openings 400. Lines enclosed by dotted boxes in FIG. 1 represent the openings 400. Each of the hollow areas A2 in FIG. 1 is provided with three lines respectively representing three openings 400.

In some other implementation modes, the backlight module further includes light emitting devices 200; the light emitting devices 200 are arranged on the backboard 100 exposed out of the hollow areas A2; in other words, the backboard 100 exposed out of the hollow areas A2 is provided with the light emitting devices 200.

The hollow areas are openings in the body of the reflecting sheet, and the body surrounding the hollow areas is a part, close to the hollow areas, on the body.

According to the backlight module provided by embodiments of the present disclosure, the body surrounding at least one of the hollow areas arranged on the reflecting sheet is provided with the one or more mutually independent openings, due to the arrangement of the openings, when the reflecting sheet deforms under the action of thermal expansion and cold contraction, a stress may be released by the openings to buffer an acting force of the reflecting sheet to the light emitting devices, so that the problem that the lenses fall off may be solved, and the reliability of the backlight module may be improved.

Generally, the backboard 100 is provided with a trace for realizing an external connection of signals and electricity, and the trace is used for transmitting a signal for driving light emitting chips 210 to emit light. In some embodiments of the present disclosure, a backboard 100 may be set as a Flexible Printed Circuit (FPC) or a Printed Circuit Board (PCB).

In some embodiments of the present disclosure, as shown in FIG. 1 to FIG. 2b, the openings 400 may be arranged on the body A1 surrounding the hollow areas A2 of the reflecting sheet. Exemplarily, the openings may be set as slits 410. The body A1 surrounding at least one of the hollow areas A2 may be provided with one or more slits 410. For example, the body A1 surrounding each of the hollow areas A2 may be provided with a plurality of mutually independent slits 410. Or the body A1 surrounding each of the hollow areas A2 may be provided with one slit 410. Or the body A1 surrounding part of the hollow areas A2 may be provided with a plurality of mutually independent slits 410, or the body A1 surrounding part of the hollow areas A2 may be provided with one slit 410. For example, a local area of the backlight module is obviously affected by temperature changes, then, the hollow areas in the area may be set, so that the body surrounding each of the hollow areas in the area is provided with a plurality of mutually independent openings. Of course, the arrangement of the openings may be designed and determined according to an actual application environment, but is not limited herein.

During an actual application, for the reflecting sheet 300, the light is reflected from the side where the light emitting devices 200 are located, and in order to realize the normal reflection of light, the reflecting sheet 300 generally includes a substrate and a reflecting layer located at the side, facing lenses 220, of the substrate. The material of the substrate of the reflecting sheet 300 may be set as a transparent material. The material of the reflecting layer may be set as Polymethyl Methacrylate (PMMA) or a metal with a high reflectivity, but is not limited herein.

In some embodiments of the present disclosure, as shown in FIG. 1 to FIG. 2b, the slits 410 surrounding the hollow areas A2 are slits penetrating from an upper surface S1 to a lower surface S2 of the reflecting sheet 300. For example, the upper surface S1 of the reflecting sheet 300 refers to the upper surface of the side, opposite to the substrate, of the reflecting layer of the reflecting sheet 300, and the lower surface S2 of the reflecting sheet 300 refers to the lower surface of the side, opposite to the reflecting layer, of the substrate of the reflecting sheet 300.

In some embodiments of the present disclosure, as shown in FIG. 1 to FIG. 2b, the slits 410 surrounding the hollow areas A2 are connected with the hollow areas A2 of the reflecting sheet 300. In other words, the slits 410 extend from the body A1 surrounding the hollow areas A2 to the hollow areas A2, so that the slits 410 and the hollow areas A2 are connected. In this way, when the reflecting sheet deforms under the action of thermal expansion and cold contraction, a stress may be released by the openings to buffer an acting force of the reflecting sheet to the lenses, so that the problem that the lenses fall off may be solved, and the reliability of the backlight module may be improved.

In some embodiments of the present disclosure, as shown in FIG. 1 to FIG. 2b, each of the light emitting devices 200 may include: a light emitting chip 210 located on the backboard 100 and a lens 220 covering the light emitting chip 210. Moreover, orthographic projections of the lenses 220 on the backboard 100 are complementary to that of the body A1 provided with the hollow areas A2 on the backboard 100. In some implementation modes, the backlight module is internally provided with a plurality of light bars, and each of the light bars is provided with a plurality of light emitting chips (such as LEDs). Generally, a process of fabricating the backlight module includes: providing the backboard, and locking the light bars and the backboard 100 by using screws, next, aligning the hollow areas A2 of the reflecting sheet 300 to the lenses 220, and then, pressing and assembling the reflecting sheet on the backboard to expose the lenses 220 out of the hollow areas A2. In some embodiments of the present disclosure, orthographic projections of the hollow areas A2 on the backboard 100 are complementary to those of the lenses 220 on the backboard 100, thus, there are very small gaps and even no gaps between the edges of the hollow areas A2 and the lenses 220, and furthermore, the problem that shadows exist due to larger gaps between the edges of the hollow areas A2 and the lenses 220 may be solved. Moreover, due to the arrangement of the openings, when the reflecting sheet deforms under the action of thermal expansion and cold contraction, a stress may be released by the openings to buffer an acting force of the reflecting sheet to the lenses, so that the problem that the lenses fall off may be solved, and the reliability of the backlight module may be improved.

Figure 3:
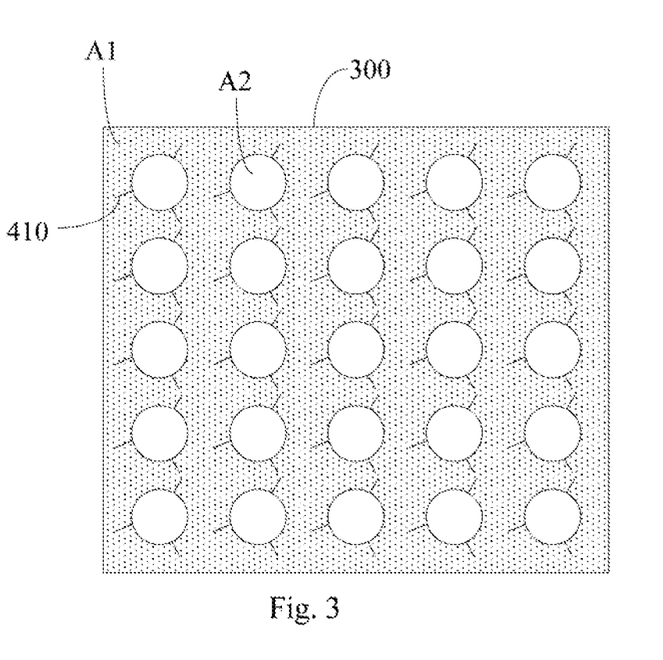
FIG. 3 is a schematic diagram of a top view structure of a reflecting sheet provided by an embodiment of the present disclosure.

In some embodiments of the present disclosure, as shown in FIG. 1 and FIG. 3, the shape of each of the hollow areas A2 may include a round, namely the hollow areas A2 include round hollow areas. Generally, the light emitted by the light emitting chips 210 exits through the lenses 220 after penetrating through the lenses 220. In order to ensure that the light emitted by the lenses are completely emitted, but are not blocked by the reflecting sheet, the hollow areas A2 are arranged, and the lenses 220 are arranged on the hollow areas A2 and completely stretch out of the upside of the reflecting sheet. Moreover, in order to coordinate the hollow areas A2 and the lenses 220, the shapes of the hollow areas A2 may be set to be approximately identical to those of the lenses 220 corresponding to the hollow areas A2. In some embodiments of the present disclosure, as shown in FIG. 2a and FIG. 3, a shadow area of the reflecting sheet 300 represents the body A1, and open areas (such as blank areas as shown in FIG. 3) except the body A1 represent the hollow areas A2. Exemplarily, in a direction perpendicular to the backboard 100, the outmost circumferences of the lenses 220 may be set to be round, then, the hollow areas A2 may also be set to be round.

Figure 5:
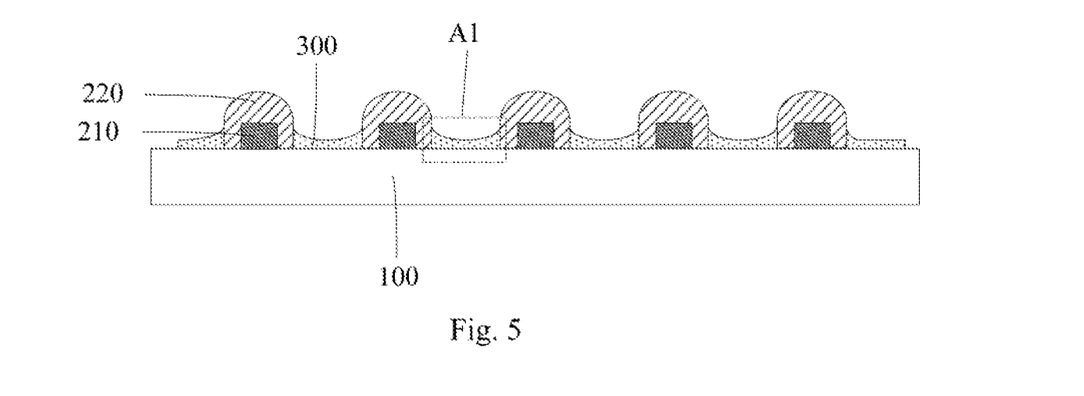
FIG. 5 is a schematic diagram of a sectional structure of another backlight module as shown in FIG. 1 along the direction AA'.

In some embodiments of the present disclosure, as shown in FIG. 1 and FIG. 5, the body A1 of the reflecting sheet 300 between two adjacent lenses is arched, a convex surface of the arched body A1 of the reflecting sheet faces the backboard 100, and an end surface, forming the hollow areas A2, in the arched body A1 of the reflecting sheet clings to the lenses 300. As shown in combination with FIG. 1 and FIG. 5, for the hollow area A2 of which the area is less than that of the lens 220, the side, close to the light emitting device 200, of the body A1 surrounding the hollow area A2 is in contact with the corresponding lens 220, and a curved surface is formed from the body A1 in contact with the backboard 100 and the body A1 in contact with the lenses 220. The reflecting sheet 300 in the present disclosure has a structure shown as FIG. 5, and further includes the openings 400 corresponding to the hollow areas A2 in addition to the hollow areas A2. When the backlight module in the present disclosure is overlooked by facing a light emergent side of the backlight module, a top view of the backlight module is shown as FIG. 1, a sectional view of the backlight module is shown as FIG. 5, and known from the figures, light emitting chips 210 are located on the bottommost layer and are mounted on the backboard 100, the lenses 220 cover the light emitting chips 210, the body A1 surrounding the hollow areas A2 is not laid flat on the backboard 100, but the edge of the body A1 surrounding the hollow areas A2 leans against the lenses 220. The body surrounding the hollow areas in the present disclosure is provided with the openings, due to the existence of the openings 400, when the reflecting sheet deforms under the action of thermal expansion and cold contraction, a stress generated by the thermal deformation of the reflecting sheet 300 may be released by the openings 400, so that the phenomenon that the deflector plate deforms to apply a pressure to the lenses 220 is avoided, and the lenses 220 are prevented from falling off. Moreover, due to the existence of the openings 400, a process that the lenses 220 penetrate through the hollow areas A2 is easier to operate, and irreversible deformation generated around the hollow areas A2 may also be avoided when the lenses 220 penetrate through the hollow areas A2.

Figure 4:
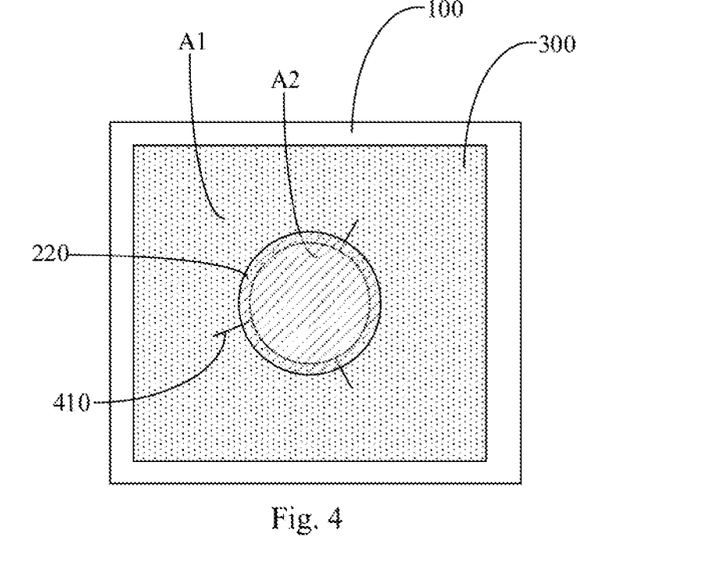
FIG. 4 is a schematic diagram of a top view structure of the reflecting sheet and a lens provided by an embodiment of the present disclosure.

In some embodiments of the present disclosure, as shown in combination with FIG. 4, the area of at least one of the round hollow areas A2 may be less than that of the round lens 220 corresponding to the hollow area A2. Exemplarily, the area of each of the round hollow areas A2 may be less than that of the round lens 220 corresponding to the hollow area A2. As shown in combination with FIG. 4, the area S1 of an orthographic projection of the edge of each of the hollow areas A2 on the backboard 100 is less than the area S2 of an orthographic projection of the edge of each of the lenses 220 on the backboard 100.

In order to further avoid the phenomenon that the body of the reflecting sheet applies a pressure to the lenses 220 due to deformation and prevent the lenses 220 from falling off, in some embodiments of the present disclosure, for each of the hollow areas A2, on the end surfaces of the openings of the hollow areas A2, the openings 400 are longer than parts, leaning against the lenses 220, on the hollow areas A2. In this way, excessive parts, leaning against the lenses 220, on the hollow areas A2 may be avoided, there is still a margin for the openings, and thus, when a pressure is applied to the lenses 220 due to deformation of the reflecting sheet 300 under the action of thermal expansion and cold contraction, a stress may be released to prevent the lenses 220 from falling off.

Generally, lenses and LEDs are fixedly arranged on a backboard by using an adhesive, in some embodiments of the present disclosure, as shown in FIG. 1, the backlight module may further include a plurality of mutually independent adhesive points 510 between the lenses 220 and the backboard 100; and an extension line from the opening 400 arranged on the body A1 surrounding the hollow area A2 to the center of the hollow area A2 is provided with one or more adhesive points 510 for connecting the backboard 100 and the lens 220. In an actual preparation process, the adhesive on the adhesive points is relatively soft, after the lens 220 is arranged on an adhesive layer, part of the adhesive may be extruded to a light emergent side of the lens and even attached to the light emergent side of the part, close to the backboard 100, of the lens 220, and thus, the part of lens 220 is not smooth. The extension line from the opening 400 arranged on the body A1 surrounding the hollow area A2 to the center of the hollow area A2 is provided with the adhesive points 510, so that the opening 400 is arranged to correspond to the adhesive point 510, the opening 400 may correspond to the location where the adhesive attached to the outer side of the part, close to the backboard 100, of the lens 220 is located, furthermore, when a pressure is applied to the lenses 220 due to thermal deformation of the reflecting sheet 300, a stress may be released to prevent the lenses 220 from falling off.

Figure 6:
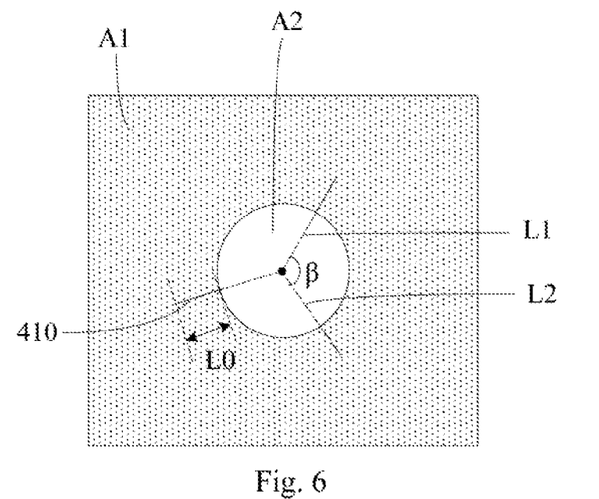
FIG. 6 is a schematic diagram of a partial top view structure of the reflecting sheet provided by an embodiment of the present disclosure.
Figure 7A:
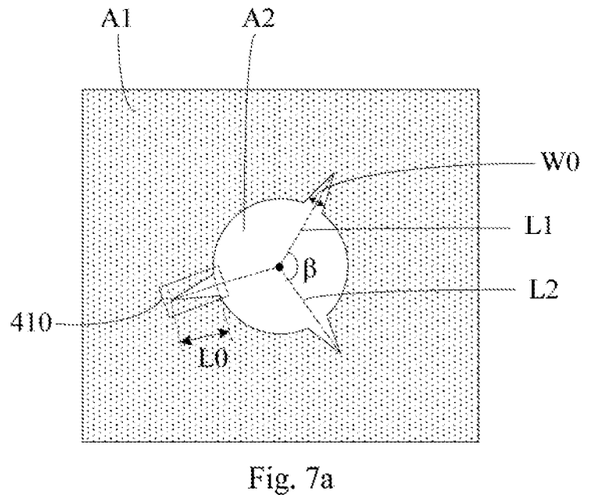
FIG. 7a is a schematic diagram of another partial top view structure of the reflecting sheet provided by an embodiment of the present disclosure.
Figure 7B:
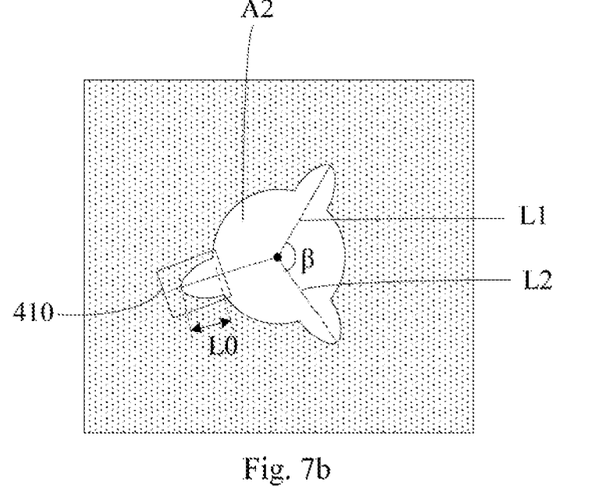
FIG. 7b is a schematic diagram of another partial top view structure of the reflecting sheet provided by an embodiment of the present disclosure.
Figure 8:
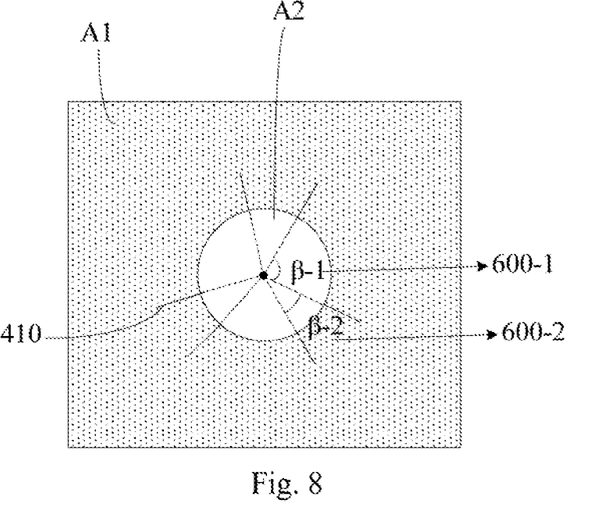
FIG. 8 is a schematic diagram of another partial top view structure of the reflecting sheet provided by an embodiment of the present disclosure.
Figure 9:
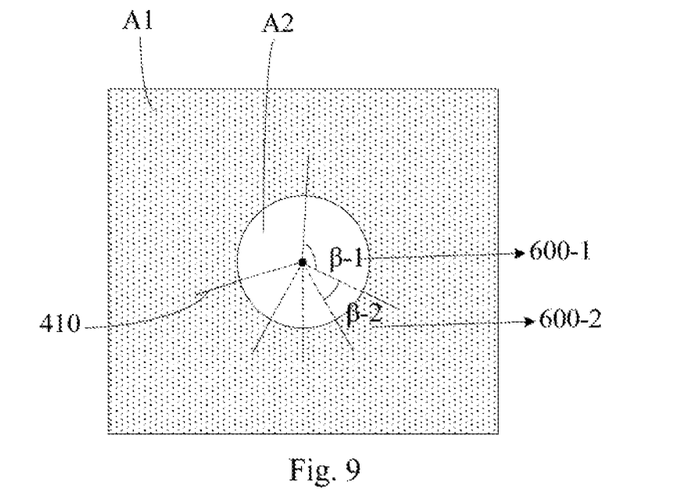
FIG. 9 is a schematic diagram of another partial top view structure of the reflecting sheet provided by an embodiment of the present disclosure.

In some embodiments of the present disclosure, as shown in FIG. 6 to FIG. 9, the slits 410 have widths perpendicular to extension directions of the slits. Exemplarily, as shown in FIG. 6, FIG. 8 and FIG. 9, widths of at least two of the plurality of slits may be equal. For example, widths of at least part of the slits 410 may be equal. For example, for one hollow area A2 and one slit 410 which are nearest, the above-mentioned widths of the at least part of the slits 410 may be equal in a direction directed from the hollow areas A2 to the slits 410. In other words, the slits 410 may be set to have the equal width and extend from the hollow areas A2 to the body A1. In this way, the slits 410 corresponding to the same hollow area A2 may be symmetrically arranged as much as possible, thereby reducing influences to a lighting effect. Exemplarily, the widths of part of the slits 410 in all the slits 410 may be equal, or the widths of all the slits 410 may be equal, limitations thereof are omitted herein.

Exemplarily, as shown in FIG. 7a and FIG. 7b, the width of at least one of the plurality of slits is reduced with the increment of distance from the slit to the hollow area. For example, the widths of at least part of the plurality of slits may also be reduced with the increment of distances from the slits 410 to the hollow areas A2. For example, for one hollow area A2 and one slit 410 which are nearest, the above-mentioned widths WO may be sequentially reduced in a direction directed from the hollow areas A2 to the slits 410. In this way, the slits 410 corresponding to the same hollow area A2 may be symmetrically arranged as much as possible, thereby reducing influences to a lighting effect. In other words, the openings may be set as grooves which extend from the hollow areas A2 to the body A1 and are arranged in the body A1 of the reflecting sheet, and openings of the grooves depart from the body A1. Of course, the openings may further include combinations of slits and grooves extending from the hollow areas A2 to the body A1. Of course, during an actual application, the above-mentioned way may be designed and determined according to an actual application environment, but is not limited herein.

In some embodiments of the present disclosure, the slits may be triangular or shaped like a part of an ellipse. Exemplarily, as shown in FIG. 7a, the slits 410 may be triangular. Exemplarily, as shown in FIG. 7b, the slits 410 may be shaped like a part of an ellipse. Or the slits 410 may also be arc-shaped, trapezoidal and the like. Of course, the shapes of the slits may also be designed and determined according to an actual application environment, but are not limited herein.

In some embodiments of the present disclosure, as shown in combination with FIG. 6 to FIG. 7b, the slits 410 have lengths L0 along extension directions of the slits and may be 1 mm-2 mm long. In this way, when a pressure is applied to the lenses 220 due to thermal deformation of the reflecting sheet 300, a stress may be released to prevent the lenses 220 from falling off, and meanwhile, the problem that the light reflecting effect of the reflecting sheet is lowered caused by overlong slits may be avoided. Exemplarily, the lengths of the slits 410 may be set to be 1 mm or 1.5 mm or 2 mm. During an actual application, the lengths of the slits may be designed and determined according to an actual application environment, but are not limited herein.

In some embodiments of the present disclosure, as shown in combination with FIG. 6 to FIG. 7b, the plurality of slits 410 may be equidistantly arranged on the body A1 and arranged on radius extension lines of the round hollow area A2. In other words, the plurality of slits 410 are equidistantly arranged on the radius extension lines of the round hollow area A2. In this way, the slits 410 corresponding to the same hollow area A2 may be symmetrically arranged as much as possible, thereby reducing influences to a lighting effect. Moreover, when a pressure is applied to the lenses 220 due to thermal deformation of the reflecting sheet 300, a stress may be released to prevent the lenses 220 from falling off. Further, generally, each of the lenses is correspondingly provided with three adhesive points which may be approximately three vertex angles of an equilateral triangle, and therefore, each of the hollow areas A2 may be provided with three openings 400.

In some embodiments of the present disclosure, as shown in FIG. 1 and FIG. 3, each of the hollow areas A2 provided with the slits 410 may be periodically arranged on the reflecting sheet 300. In this way, the reflecting sheet 300 may be uniformly provided with the hollow areas A2 provided with the slits 410, and furthermore, when a pressure is applied to the lenses 220 due to thermal deformation of the reflecting sheet 300, a stress may be released to prevent the lenses 220 from falling off.

Exemplarily, as shown in FIG. 1 and FIG. 3, for the slits located on the same location corresponding to each of the hollow areas A2, the lengths, widths and inclination angles of these slits may be the same. In this way, the slits may be further symmetrically arranged, thereby reducing influences to a lighting effect. Moreover, the design difficulty of the slits may also be lowered.

In some embodiments of the present disclosure, as shown in FIG. 6 to FIG. 9, in the same hollow area A2, an included angles β is formed between connecting lines of every two adjacent slits 410 and the center of a circle (referring to locations of black spots in FIG. 6 and FIG. 9) of the round hollow area A2, and angles of at least part of the included angles β are enabled to be the same. Exemplarily, for two adjacent slits 410, an included angle β is formed between a connecting line L1 of one slit 410 and the center of a circle of the round hollow area A2 and a connecting line L2 of the other slit 410 and the center of the circle of the round hollow area A2.

In some embodiments of the present disclosure, as shown in FIG. 6 to FIG. 7b, each included angle β corresponding to each of the hollow areas A2 may be the same. In this way, when a pressure is applied to the lenses 220 due to thermal deformation of the reflecting sheet 300, a stress may be uniformly released to prevent the lenses 220 from falling off. Further, generally, each of the lenses is correspondingly provided with three adhesive points which may be approximately three vertex angles of an equilateral triangle, and therefore, each of the hollow areas A2 may be provided with three slits 410, and β may be approximately 120 degrees.

Of course, part of the included angles β may be the same, and part of the included angles β may be different. In some embodiments of the present disclosure, as shown in FIG. 8, the included angles β are divided into at least two included angle groups, wherein included angles in the same included angle group are the same, and included angles in different included angle groups are different. Optionally, the included angle groups where two adjacent included angles β are located may be different. For example, as shown in FIG. 8, the included angles β may be divided into two included angle groups 600-1 and 600-2. Included angles β-1 in the included angle group 600-1 and included angles β-2 in the included angle group 600-2 are alternately arranged, so that the two adjacent included angles β-1 and β-2 may be different.

Optionally, in some embodiments of the present disclosure, the included angles in the same included angle group are adjacent. For example, as shown in FIG. 9, the included angles β may be divided into the two included angle groups 600-1 and 600-2. The included angle group 600-1 is provided with a plurality of adjacent included angles β-1, the included angle group 600-2 is also provided with a plurality of adjacent included angles β-2, and the included angle groups 600-1 and 600-2 are set as a whole.

It should be noted that the same in the above-mentioned features may not be identical and may have some deviations in an actual process due to restrictions of process conditions or other factors, and therefore, the same relationships among all the above-mentioned features shall fall within the protective scope of the present disclosure as long as they approximately meet the above-mentioned conditions. For example, the above-mentioned same may be the same allowed within an error allowable range.

Figure 10:
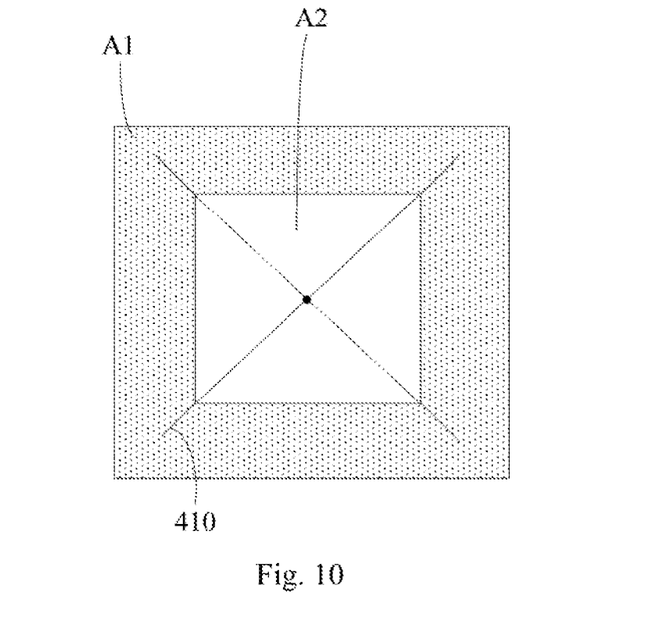
FIG. 10 is a schematic diagram of another partial top view structure of the reflecting sheet provided by an embodiment of the present disclosure.

Another backlight module provided by an embodiment of the present disclosure is shown as FIG. 10. The backlight module is transformed with specific to the implementation way in the above-mentioned embodiment. Differences of the present embodiment and the above-mentioned embodiment are only described below, but the descriptions of similarities thereof are omitted herein.

In some embodiments of the present disclosure, as shown in FIG. 10, the shape of each of the hollow areas A2 may include a rectangle (such as a square and an oblong). For example, the hollow areas A2 are rectangular hollow areas. Generally, the light emitted by the light emitting chips 210 exits through the lenses 220 after penetrating through the lenses 220. In order to ensure that the light emitted by the lenses is located on the reflecting surface of the reflecting sheet, the lenses 220 are exposed by the hollow areas A2. Moreover, in order to ensure that the hollow areas A2 are coordinated with the lenses 220, the shapes of the hollow areas A2 may be set to be approximately same as those of the lenses 220 corresponding to the hollow areas A2. In some embodiments of the present disclosure, as shown in FIG. 10, in a direction perpendicular to the backboard, the outmost circumferences of the lenses 220 are set to be rectangular (such as square), and thus, the hollow areas A2 may also be rectangular (such as square). The following is described with an example in which the openings are the slits.

In some embodiments of the present disclosure, as shown in FIG. 10, an extension line of at least one diagonal of the rectangular hollow area A2 is provided with the slits 410, and extension directions of the slits 410 are the same as an extension direction of the extension line of the diagonal. In this way, the slits 410 corresponding to the same hollow area A2 may be symmetrically arranged as much as possible, thereby reducing influences to a lighting effect. Exemplarily, as shown in FIG. 10, an extension line of each diagonal in the rectangular hollow area A2 is provided with the slits 410, and extension directions of the slits 410 are the same as an extension direction of the extension line, provided with the slits 410, of the diagonal. Or for one in two diagonals in the rectangular hollow area A2, such one diagonal may be provided with the slits 410, the limitations thereof are omitted herein.

In some embodiments of the present disclosure, each of the hollow areas A2 provided with the slits 410 may be periodically arranged on the reflecting sheet 300. In this way, the reflecting sheet 300 may be uniformly provided with the hollow areas A2 provided with the slits 410, and furthermore, when a pressure is applied to the lenses 220 due to thermal deformation of the reflecting sheet 300, a stress may be released to prevent the lenses 220 from falling off.

Figure 11A:
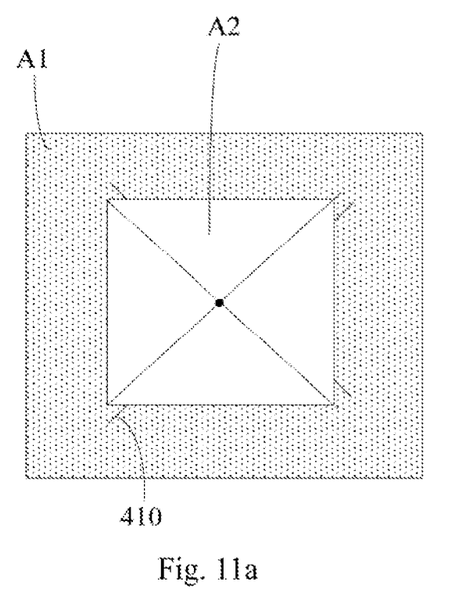
FIG. 11a is a schematic diagram of another partial top view structure of the reflecting sheet provided by an embodiment of the present disclosure.
Figure 11B:
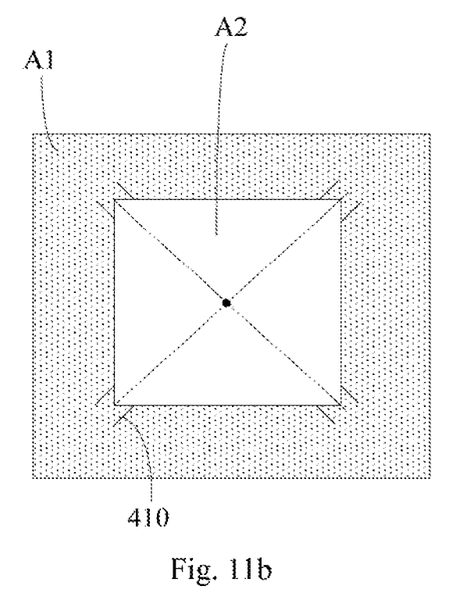
FIG. 11b is a schematic diagram of another partial top view structure of the reflecting sheet provided by an embodiment of the present disclosure.

Some further backlight modules provided by embodiments of the present disclosure are shown as FIG. 11a and FIG. 11b. The backlight modules are transformed with specific to the implementation way in the above-mentioned embodiment. Differences of the present embodiment and the above-mentioned embodiment are only described below, but the descriptions of similarities thereof are omitted herein.

In some embodiments of the present disclosure, as shown in FIG. 11a, the hollow areas include rectangular hollow areas; and one side of an extension line of at least one diagonal of the rectangular hollow area A2 is provided with the slits 410, and extension directions of the slits 410 are the same as an extension direction of the extension line of the diagonal. In this way, the slits 410 corresponding to the same hollow area A2 may be symmetrically arranged as much as possible, thereby reducing influences to a lighting effect. Exemplarily, one side of an extension line of each of the two diagonals of the rectangular hollow area A2 may be provided with the slits 410.

In some embodiments of the present disclosure, as shown in FIG. 11b, the hollow areas include rectangular hollow areas; and two sides of an extension line of at least one diagonal of the rectangular hollow area A2 are provided with the slits 410, and extension directions of the slits 410 are the same as an extension direction of the extension line of the diagonal. In this way, the slits 410 corresponding to the same hollow area A2 may be symmetrically arranged as much as possible, thereby reducing influences to a lighting effect. Exemplarily, each of two sides of an extension line of each of the two diagonals of the rectangular hollow area A2 may be provided with the slits 410.

In some embodiments of the present disclosure, as shown in FIG. 11b, the slits 410 located at two sides of the extension line of the same diagonal may be approximately in mirror symmetry relative to the extension line of the diagonal. In this way, the slits 410 corresponding to the same hollow area A2 may be symmetrically arranged as much as possible, thereby reducing influences to a lighting effect. Exemplarily, the slits 410 which correspond to the same hollow area A2 and are located at two sides of the extension line of the same diagonal are oppositely arranged, and the slits 410 located at two sides of the extension line of the same diagonal are in mirror symmetry, in this way, a stress may be further released more uniformly, and the risk that the lenses fall off may be further reduced.

In some embodiments of the present disclosure, each of the hollow areas A2 provided with the slits 410 may be periodically arranged on the reflecting sheet 300. In this way, the reflecting sheet 300 may be uniformly provided with the hollow areas A2 provided with the slits 410, and furthermore, when a pressure is applied to the lenses 220 due to thermal deformation of the reflecting sheet 300, a stress may be released to prevent the lenses 220 from falling off.

Figure 12:
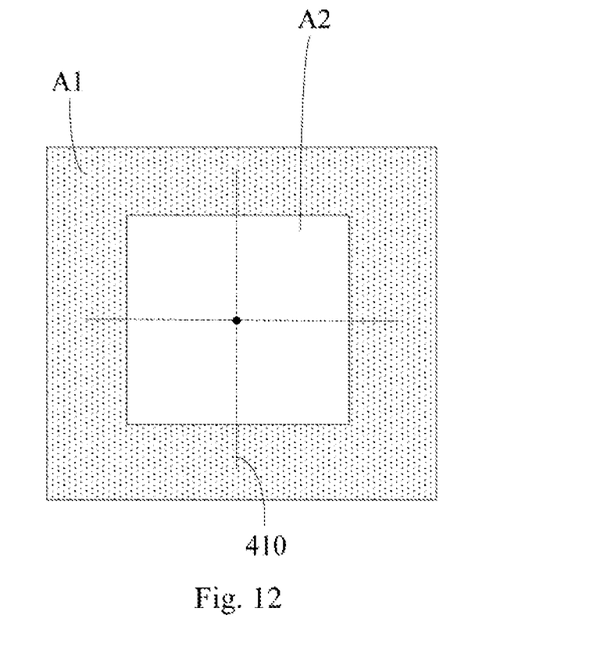
FIG. 12 is a schematic diagram of another partial top view structure of the reflecting sheet provided by an embodiment of the present disclosure.

Another backlight module provided by an embodiment of the present disclosure is shown as FIG. 12. The backlight module is transformed with specific to the implementation way in the above-mentioned embodiment. Differences of the present embodiment and the above-mentioned embodiment are only described below, but the descriptions of similarities thereof are omitted herein.

In some embodiments of the present disclosure, as shown in FIG. 12, the hollow area includes a rectangular hollow area; moreover, a perpendicular bisector of at least one side in four sides of the rectangular hollow area A2 is provided with the slits 410, and extension directions of the slits 410 are the same as an extension direction of the perpendicular bisector. Exemplarily, a perpendicular bisector of each side in four sides of the rectangular hollow area A2 may be provided with the slits 410, and the slits 410 extend on the corresponding perpendicular bisector. In this way, the slits 410 corresponding to the same hollow area A2 may be symmetrically arranged as much as possible, thereby reducing influences to a lighting effect. Moreover, a stress may be further released more uniformly, and the risk that the lenses fall off may be further reduced.

In some embodiments of the present disclosure, each of the hollow areas A2 provided with the slits 410 may be periodically arranged on the reflecting sheet 300. In this way, the reflecting sheet 300 may be uniformly provided with the hollow areas A2 provided with the slits 410, and furthermore, when a pressure is applied to the lenses 220 due to thermal deformation of the reflecting sheet 300, a stress may be released to prevent the lenses 220 from falling off.

Figure 13:
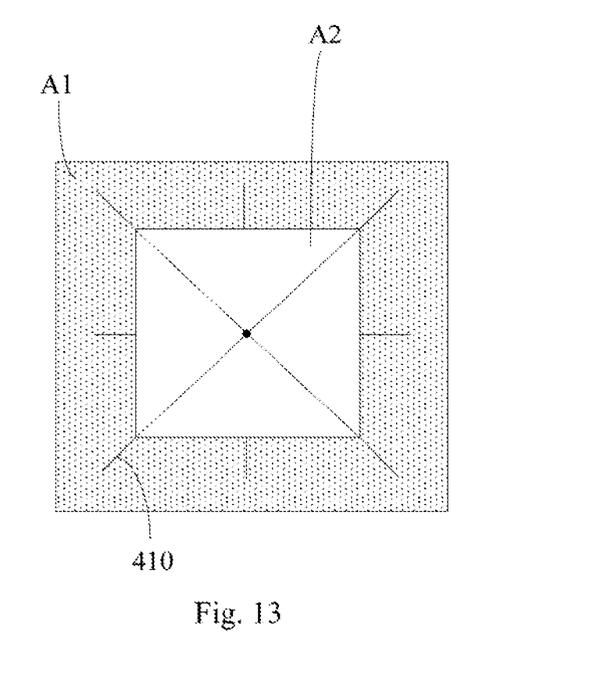
FIG. 13 is a schematic diagram of another partial top view structure of the reflecting sheet provided by an embodiment of the present disclosure.

Another backlight module provided by an embodiment of the present disclosure is shown as FIG. 13. The backlight module is transformed with specific to the implementation way in the above-mentioned embodiment. Differences of the present embodiment and the above-mentioned embodiment are only described below, but the descriptions of similarities thereof are omitted herein.

In some embodiments of the present disclosure, as shown in FIG. 13, the hollow area includes a rectangular hollow area; moreover, an extension line of at least one diagonal of the rectangular hollow area A2 is provided with the slits 410, and extension directions of the slits 410 are the same as an extension direction of the extension line of the diagonal. In this way, the slits 410 corresponding to the same hollow area A2 may be symmetrically arranged as much as possible, thereby reducing influences to a lighting effect. Exemplarily, as shown in FIG. 13, an extension line of each diagonal in the rectangular hollow area A2 is provided with the slits 410, and extension directions of the slits 410 are the same as an extension direction of the extension line, provided with the slits 410, of the diagonal. Or for one in two diagonals in the rectangular hollow area A2, such one diagonal may be provided with the slits 410, the limitations thereof are omitted herein.

Moreover, in some embodiments of the present disclosure, as shown in FIG. 13, a perpendicular bisector of at least one side in four sides of the rectangular hollow area A2 is provided with the slits 410, and extension directions of the slits 410 are the same as an extension direction of the perpendicular bisector. Exemplarily, a perpendicular bisector of each side in four sides of the rectangular hollow area A2 may be provided with the slits 410, and the slits 410 extend on the corresponding perpendicular bisector. In this way, the slits 410 corresponding to the same hollow area A2 may be symmetrically arranged as much as possible, thereby reducing influences to a lighting effect. Moreover, a stress may be further released more uniformly, and the risk that the lenses fall off may be further reduced.

In some embodiments of the present disclosure, each of the hollow areas A2 provided with the slits 410 may be periodically arranged on the reflecting sheet 300. In this way, the reflecting sheet 300 may be uniformly provided with the hollow areas A2 provided with the slits 410, and furthermore, when a pressure is applied to the lenses 220 due to thermal deformation of the reflecting sheet 300, a stress may be released to prevent the lenses 220 from falling off.

Figure 14:
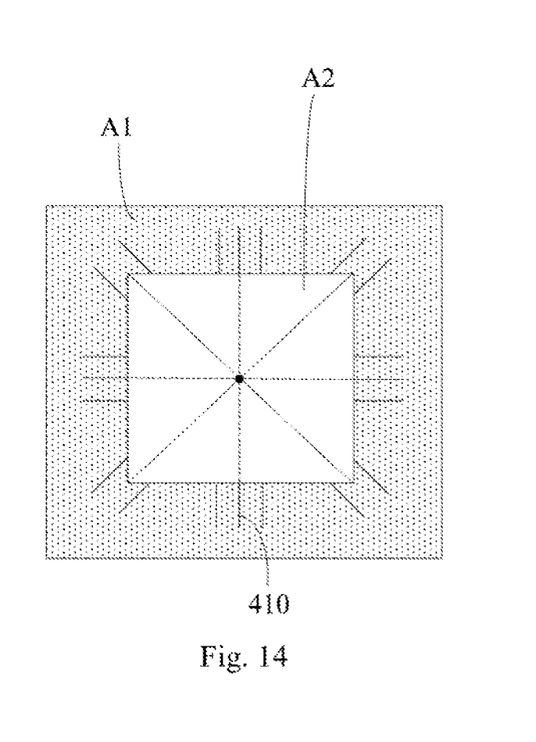
FIG. 14 is a schematic diagram of another partial top view structure of the reflecting sheet provided by an embodiment of the present disclosure.

Another backlight module provided by an embodiment of the present disclosure is shown as FIG. 14. The backlight module is transformed with specific to the implementation way in the above-mentioned embodiment. Differences of the present embodiment and the above-mentioned embodiment are only described below, but the descriptions of similarities thereof are omitted herein.

In some embodiments of the present disclosure, as shown in FIG. 14, two sides of a perpendicular bisector of at least one side in four sides of the rectangular hollow area A2 are provided with the slits 410, and extension directions of the slits 410 are the same as an extension direction of the perpendicular bisector. Exemplarily, two sides of a perpendicular bisector of each side in four sides of the rectangular hollow area A2 may be provided with the slits 410. In this way, the slits 410 may be symmetrically arranged as much as possible, thereby reducing influences to a lighting effect. Moreover, the reflecting sheet 300 is uniformly provided with the hollow areas A2 provided with the slits 410, and furthermore, when a pressure is applied to the lenses 220 due to thermal deformation of the reflecting sheet 300, a stress may be released to prevent the lenses 220 from falling off.

In some embodiments of the present disclosure, as shown in FIG. 14, two sides of the extension line of the diagonal of the rectangular hollow area A2 are provided with two slits 410, and extension directions of the two slits 410 are the same as an extension direction of the extension line of the diagonal; and the two slits are in mirror symmetry relative to the extension line of the diagonal. In this way, the slits 410 may be symmetrically arranged as much as possible, thereby reducing influences to a lighting effect.

It should be noted that the features in the above-mentioned embodiments may be combined with one another without conflicts, and the descriptions thereof are omitted herein.

Based on the same concept, an embodiment of the present disclosure further provides a display device including the above-mentioned backlight module provided by the embodiment of the present disclosure. The problem solving principle of the display device is similar to that of the above-mentioned backlight module, and therefore, the implementation of the display device may refer to that of the above-mentioned backlight module, the descriptions thereof are omitted herein.

In some embodiments of the present disclosure, the display device may further include a display panel located at a light emergent side of the backlight module. Exemplarily, the display panel may be a liquid crystal display panel.

In some embodiments of the present disclosure, the display device may be any one product or component with a display function, such as a mobile phone, a tablet personal computer, a television, a display, a notebook computer, a digital photo frame and a navigator. The ordinary skilled in the art should understand that other essential components of the display device are provided, the descriptions thereof are omitted herein, and the components should not be regarded as limitations on the present disclosure.

According to the backlight module and the display device provided by the embodiments of the present disclosure, the body surrounding at least one of the hollow areas arranged on the reflecting sheet is provided with multiple mutually independent openings, due to the arrangement of the openings, when the reflecting sheet deforms under the action of thermal expansion and cold contraction, a stress may be released by the openings to buffer an acting force of the reflecting sheet to the light emitting devices, so that the problem that the lenses fall off may be solved, and the reliability of the backlight module may be improved.

Obviously, the skilled in the art can make various alterations and variations on the embodiments of the present disclosure without opposite to the spirit and scope of the embodiments of the present disclosure. In this way, if these alterations and variations of the embodiments of the present disclosure fall within the scopes of the claims and the equivalent technologies of the present disclosure, the present disclosure is also intended to include the alterations and variations.

The invention claimed is:

1. A backlight module, comprising:
a backboard; and
a reflecting sheet located on the backboard;
the reflecting sheet comprising a body and a plurality of hollow areas; and
the body surrounding at least one of the hollow areas being provided with at least one opening;
wherein the backlight module further comprising:
light emitting devices;
the light emitting devices are arranged on the backboard exposed out of the hollow areas;
at least one of the light emitting devices comprises a light emitting chip and a lens, the light emitting chip is located on the backboard, and the lens covers the light emitting chip; and
an orthographic projection of each one of the lenses on the backboard are complementary to an orthographic projection of the body on the backboard;
wherein the body of the reflecting sheet between two adjacent lenses is an arched body, a convex surface of each of the arched bodies of the reflecting sheet faces the backboard, and an end surface of each of the arched bodies clings to the lens, each of the end surfaces forms a profile of one of the plurality of hollow areas.

2. The backlight module according to claim 1, wherein the opening is a slit.

3. The backlight module according to claim 2, wherein the slit surrounding the hollow areas penetrates through the reflecting sheet.

4. The backlight module according to claim 2, wherein the slit surrounding the hollow areas is connected with the hollow areas of the reflecting sheet.

5. The backlight module according to claim 2, wherein the hollow areas comprise round hollow areas, and the body comprises a plurality of slits, the slits are equidistantly arranged on the body and are arranged on radius extension lines of the round hollow areas.

6. The backlight module according to claim 2, wherein the hollow areas comprise rectangular hollow areas; and
an extension line of at least one diagonal of each of the rectangular hollow areas is provided with the slit, and an extension direction of the slit is same as an extension direction of the extension line of the diagonal.

7. The backlight module according to claim 2, wherein the hollow areas comprise rectangular hollow areas; and at least one side of an extension line of at least one diagonal of each of the rectangular hollow areas is provided with the slit, and an extension direction of the slit is same as an extension direction of the extension line of the diagonal.

8. The backlight module according to claim 2, wherein the hollow areas comprise rectangular hollow areas;
- a perpendicular bisector of at least one side in four sides of each of the rectangular hollow areas is provided with the slit, and an extension direction of the slit is the same as an extension direction of the perpendicular bisector; and/or
- two sides of a perpendicular bisector of at least one side of in four sides of each of the rectangular hollow areas are provided with the slit, and an extension direction of the slit is the same as an extension direction of the perpendicular bisector.

9. The backlight module according to claim 8, wherein two sides of the extension line of the diagonal of each of the rectangular hollow areas are provided with one slit respectively, and extension directions of two slits are the same as an extension direction of the extension line of the diagonal; and the two slits are in mirror symmetry relative to the extension line of the diagonal.

10. The backlight module according to claim 2, wherein a length of the slit is 1 mm-2 mm.

11. The backlight module according to claim 2, wherein the body comprises a plurality of slits, and widths of at least two of the plurality of slits are equal.

12. The backlight module according to claim 2, wherein the body comprises a plurality of slits, a width of at least one of the plurality of slits decreases as a distance from the slit to a nearest one of the hollow areas increases.

13. The backlight module according to claim 12, wherein the slits are triangular or shaped like a part of an ellipse.

14. The backlight module according to claim 1, further comprising a plurality of mutually independent adhesive points between the lens and the backboard; and
- an extension line from the opening arranged on the body surrounding each of the plurality of hollow areas to a center of each of the plurality of hollow areas is provided with one or more adhesive points for connecting the backboard and the lens.

15. The backlight module according to claim 2, wherein each of the hollow areas is a round hollow area, and provided with a plurality of slits, and the plurality of slits are equidistantly arranged on radius extension lines of each of the hollow areas; and the hollow areas provided with the slits is periodically arranged on the reflecting sheet.

16. The backlight module according to claim 2, wherein the hollow areas comprise rectangular hollow areas; the hollow areas provided with the slits are periodically arranged on the reflecting sheet; the slit comprises a plurality of slits:
- an extension line of at least one diagonal of each of the rectangular hollow areas is provided with the slits, and extension directions of the slits are same as an extension direction of the extension line of the diagonal; and/or
- at least one side of an extension line of at least one diagonal of each of the rectangular hollow areas is provided with the slits, and extension directions of the slits are same as an extension direction of the extension line of the diagonal; and/or
- a perpendicular bisector of at least one side in four sides of each of the rectangular hollow areas is provided with the slits, and extension directions of the slits are same as an extension direction of the perpendicular bisector; and/or
- two sides of a perpendicular bisector of at least one side of in four sides of each of the rectangular hollow areas are provided with one slit respectively, and extension directions of slits are same as an extension direction of the perpendicular bisector; and/or
- two sides of the extension line of the diagonal of each of the rectangular hollow areas are provided with one slit respectively, and extension directions of two slits are same as an extension direction of the extension line of the diagonal; and the two slits are in mirror symmetry relative to the extension line of the diagonal.

17. A display device, comprising a display panel and the backlight module according to claim 1, the backlight module is arranged at a light incident side of the display panel.

* * * * *